United States Patent
Montecillo

(10) Patent No.: US 7,391,871 B2
(45) Date of Patent: Jun. 24, 2008

(54) METHOD AND SYSTEM FOR PCM AUDIO RAMP AND DECAY FUNCTION

(75) Inventor: Normando Montecillo, Los Gatos, CA (US)

(73) Assignee: Broadcom Corporation, Irvine, CA (US)

( * ) Notice: Subject to any disclaimer, the term of this patent is extended or adjusted under 35 U.S.C. 154(b) by 501 days.

(21) Appl. No.: 10/933,175

(22) Filed: Sep. 2, 2004

(65) Prior Publication Data

US 2006/0036341 A1    Feb. 16, 2006

Related U.S. Application Data

(60) Provisional application No. 60/600,678, filed on Aug. 11, 2004.

(51) Int. Cl.
    *H03G 3/00*    (2006.01)
(52) U.S. Cl. ............................ 381/104; 381/107; 700/94
(58) Field of Classification Search ................. 381/104, 381/109, 119, 61; 281/107; 700/94
    See application file for complete search history.

(56) References Cited

U.S. PATENT DOCUMENTS

| | | | | |
|---|---|---|---|---|
| 5,825,899 A * | 10/1998 | Yamaguchi et al. | ........ | 381/94.4 |
| 6,047,073 A * | 4/2000 | Norris et al. | ................... | 381/61 |
| 6,535,611 B1 * | 3/2003 | Lau | ............................. | 381/104 |
| 7,088,835 B1 * | 8/2006 | Norris et al. | ................ | 381/107 |
| 2002/0126858 A1 * | 9/2002 | Yeum | ......................... | 381/101 |

* cited by examiner

*Primary Examiner*—Vivian Chin
*Assistant Examiner*—Disler Paul
(74) *Attorney, Agent, or Firm*—McAndrews, Held & Malloy, Ltd.

(57) ABSTRACT

A method and system for pulse code modulation (PCM) audio ramp and decay function may comprise receiving at least one control signal which indicates whether to enable a ramp-up function or a decay function. When the ramp-up function is enabled, an audio input signal may be modified such that an input low to high transition may make a more gradual transition from low to high at the output, and when the decay function is enabled the audio input signal may be modified such that an input high to low transition may make a more gradual transition from high to low at the output. These functionalities may reduce unwanted noise generated when there is a sudden high to low transition, or a sudden low to high transition, in audio signals.

23 Claims, 6 Drawing Sheets

METHOD AND SYSTEM FOR PCM AUDIO RAMP AND DECAY FUNCTION

CROSS-REFERENCE TO RELATED APPLICATIONS/INCORPORATION BY REFERENCE

This application makes reference, claims priority to, and claims the benefit of U.S. Provisional Application Ser. No. 60/600,678 filed Aug. 11, 2004.

The above stated application is hereby incorporated herein by reference in its entirety.

FIELD OF THE INVENTION

Certain embodiments of the invention relate to processing audio signals. More specifically, certain embodiments of the invention relate to a method and system for pulse code modulation (PCM) audio ramp and decay function.

BACKGROUND OF THE INVENTION

Pulse code modulation (PCM) is a sampling technique used for converting analog signals, usually audio signals, to digital signals. Although there are more efficient conversion techniques, for example, MPEG 1/2 audio layer 3 (MP3), the telecommunications industry, especially, still maintains and operates legacy systems that utilize PCM for converting analog voice signals to digital signals for transmission over circuit switched networks, whether local or long distance. The PCM standard utilizes a sample rate of 8000 samples per second and generates twelve to thirteen bits of linear digital data output per sample, which is then mapped via a logarithmic compression algorithm to an eight bit output. This mapping results in 64 Kbits of PCM voice data per second.

There are two algorithms that are widely used in the telecommunications industry for compressing linearly digitized voice—A Law and Mu Law. The Mu Law algorithm is used primarily in North America and the A Law algorithm is used in most of the rest of the world. The logarithm compression algorithms are utilized because the wide dynamic range of speech makes it inefficient to use linear digital encoding. By effectively reducing the dynamic range of a speech signal using algorithmic encoding, the speech signal to noise ratio is increased with respect to the linear digital sample and the smaller data size makes data transfer more efficient.

In some conventional systems, which are utilized for processing audio signals, a sudden change in volume from high to low or vice versa, may introduce annoying noises to the listener. These noises, sometimes described as clicks or pops, may also occur during startup or stoppage of playback of audio. On startup, when the speaker is at zero level, a sudden large input of data will produce a glitch which translates to a popping or clicking sound. Similarly, when playback is stopped, if the last data is a large value, the result can be a popping or clicking sound.

Some conventional systems attempt to remove these noises but in doing so introduce an added delay which is very noticeable when switching channels. Some television sets, for example, exhibit this problem when tuning to a new channel. There may be video output, but audio may be muted during a duration when the noises may be exhibited. Some other conventional systems, cable TV decoder or set-top boxes, for example, may stop the output of video and audio signals for the new channel, then use a software algorithm to try to remove the annoying noises, and then continue the output of video and audio signals.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for PCM audio ramp and decay function. Aspects of the method may comprise receiving at least one control signal which indicates whether to enable a ramp-up function or a decay function. When the ramp-up function is enabled, a barrel shifter may select one or more input audio bits, where the input audio bits may comprise input audio data and a plurality of bits set to zero, and where the input audio bits may be pipeline transferred to at least one of a plurality of registers. At least one control signal may indicate to the barrel shifter a number of bits to be shifted.

The pipelined transferred and selected one or more input audio bits may comprise any combination of at least a portion of the bits set to zero and at least a portion of the input audio data. A shift register may be used to generate a shifted signal which may be any combination of at least a portion of the pipelined transferred and selected input audio bits and at least a portion of a second input comprising a plurality of bits set to zero. At least one control signal may indicate to the shift register a number of bits to be shifted. An output audio signal may be generated which may be a difference of the pipelined transferred selected input audio bits and the shifted signal.

When the ramp-up function is enabled, at least one successive iteration may increase a value of the pipelined transferred and selected input audio bits by selecting fewer of the plurality of bits set to zero at the input to the barrel shifter. Similarly, when the decay function is enabled, at least one successive iteration may increase a value of the shifted signal by shifting fewer bits of the second input comprising a plurality of bits set to zero, thereby reducing the output audio signal.

Aspects of the system may comprise a barrel shifter, a plurality of data registers, a shift register, a subtractor and at least one received control signal. The barrel shifter may be coupled to a first data register, and the first data register may be coupled to a second data register and to a shift register. The second data register may be coupled to a first input of a subtractor, and the shift register may be coupled to a second input of the subtractor.

The barrel shifter may receive at least one of a plurality of input audio bits, which may comprise input audio data and a first plurality of bits set to zero. At least one received control signal may indicate to the barrel shifter a number of bits to shift, and the output of the barrel register may comprise any combination of at least a portion of the input audio data and at least a portion of the first plurality of bits set to zero. The output of the barrel shifter may be coupled to the input of the first data register. The output of the first data register may be coupled to the input of the second data register and to the input of the shift register.

The shift register may be adapted to receive a further input comprising a second plurality of bits set to zero. At least one received control signal may indicate to the shift register a number of bits to shift, and the output of the shift register may comprise any combination of at least a portion of the second plurality of bits set to zero and at least a portion of the output of the first data register. The output of the shift register and the output of the second data register may be the inputs to a subtractor. The output of the subtractor may be the output of the second data register minus the output of the shift register.

The barrel shifter, the first data register, the second data register and the shift register may utilize at least one of the received control signal as a clocking signal.

Another aspect of the system may comprise at least one control signal that may be generated by any circuitry which may generate an output data, such as, for example, the barrel shifter, the first data register, the second data register, or the shift register, such that the generated control signal may indicate to a next circuitry that may accept the generated output data, such as, for example, the barrel shifter, the first data register, the second data register, or the shift register, that the generated output data may be available. The system may also comprise at least one control signal that may be generated by any circuitry which may receive an input data, such as, for example, the barrel shifter, the first data register, the second data register, or the shift register, such that the generated control signal may indicate to a previous circuitry which may have sent the input data, such as, for example, the barrel shifter, the first data register, the second data register, or the shift register, that the input data may have been received.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for PCM audio ramp and decay function. Although the illustrated embodiment of the invention describes a stereo audio system with two channels of output and a centralized control unit, the invention is not so limited. Accordingly, the various embodiments of the invention may be used for any number of audio channels in a system, for example, a typical stereo output of audio systems, quadraphonic outputs of some specialized audio systems, and five or seven channel outputs of some home theater systems, or where the control functions of each component are local to that component, or some combination of local and central control.

When an audio input to the PCM audio ramp and decay function suddenly increases, aspects of the invention may introduce a gradual increase in the output volume level from soft to loud in order to avoid noise artifacts that may occur. Similarly, when the audio input to the PCM audio ramp and decay function suddenly decreases, the invention may introduce a gradual decrease in volume from loud to quiet in order to avoid noise artifacts that may occur.

Figure 1:
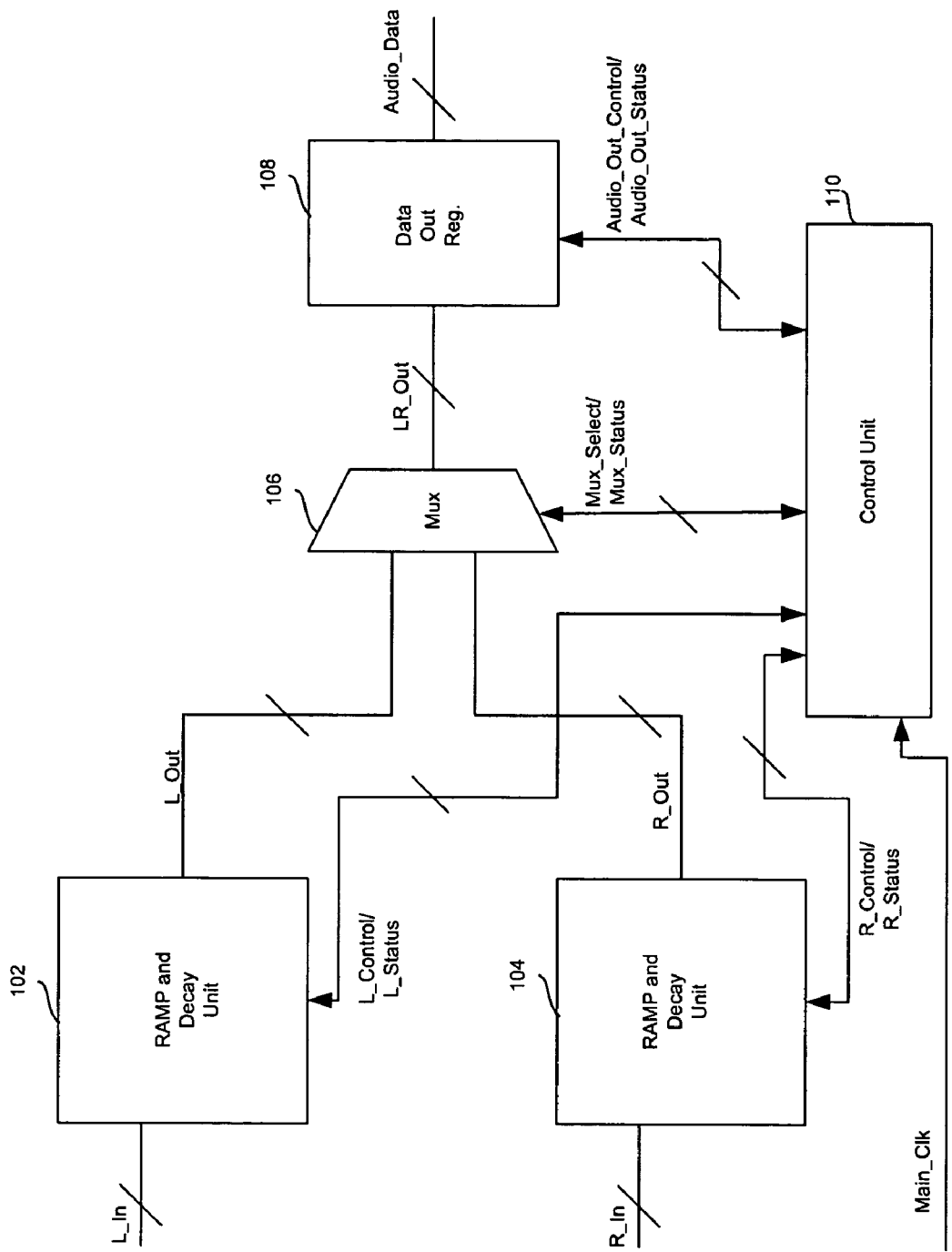
FIG. 1 is a block diagram of an exemplary system for PCM audio ramp and decay function in accordance with an embodiment of the invention.

FIG. 1 is a block diagram of an exemplary system for PCM audio ramp and decay function in accordance with an embodiment of the invention. Referring to FIG. 1, there is shown a ramp and decay unit (RDU) 102, a ramp and decay unit (RDU) 104, a multiplexer 106, a data out register (DOR) 108, and a control unit (CU) 110.

The RDU 102 comprises suitable logic, circuitry and/or code that may be utilized for a left channel and the RDU 104 comprises suitable logic, circuitry and/or code that may be utilized for a right channel. The multiplexer 106 comprises suitable logic, circuitry and/or code that may be utilized for multiplexing the left and right channels. The DOR 108 comprises suitable logic, circuitry and/or code that may be utilized to temporarily hold data. The CU 110 comprises suitable logic, circuitry and/or code that may generate control signals.

The control signals to the RDU 102 and status signals from the RDU 102 may be called L_Control and L_Status, respectively, and the control signals to the RDU 104 and status signals from the RDU 104 may be called R_Control and R_Status, respectively. The control signals to the multiplexer 106 and the status signals from the multiplexer 106 may be called Mux_Select and Mux_Status, respectively, and the control signals to the DOR 108 and the status signals from the DOR 108 may be called Audio_Out_Control and Audio_Out_Status, respectively.

The L_In signal is a signal which may be coupled to the input of the RDU 102 and may be utilized to carry the left audio channel signal bearing audio data. R_In is a signal which may be coupled to the input of the RDU 104 and may be utilized to carry the right audio channel signal bearing audio data. L_Out is a signal, which may be coupled to the output of the RDU 102 and to the input of the multiplexer 106, and may be utilized to carry the left audio channel signal bearing audio data which may have been modified by the ramp and decay unit 102. R_Out is a signal, which may be coupled to the output of the RDU 104 and to the input of the multiplexer 106, and may be utilized to carry the right audio channel signal bearing audio data which may have been modified by the ramp and decay unit 104.

LR_Out is a signal which may be coupled to the output of the multiplexer 106 and to the input of the DOR 108, and may be utilized to carry the multiplexed signal bearing both channels of audio data from the ramp and decay units 102 and 104. Audio_Data is a signal which may be coupled to the output of the DOR 108 and which may be a synchronized audio signal bearing audio data at a desired output rate, for example, 88.2 KHz if each audio channel has digital samples at 44.1 KHz rate.

Figure 2:
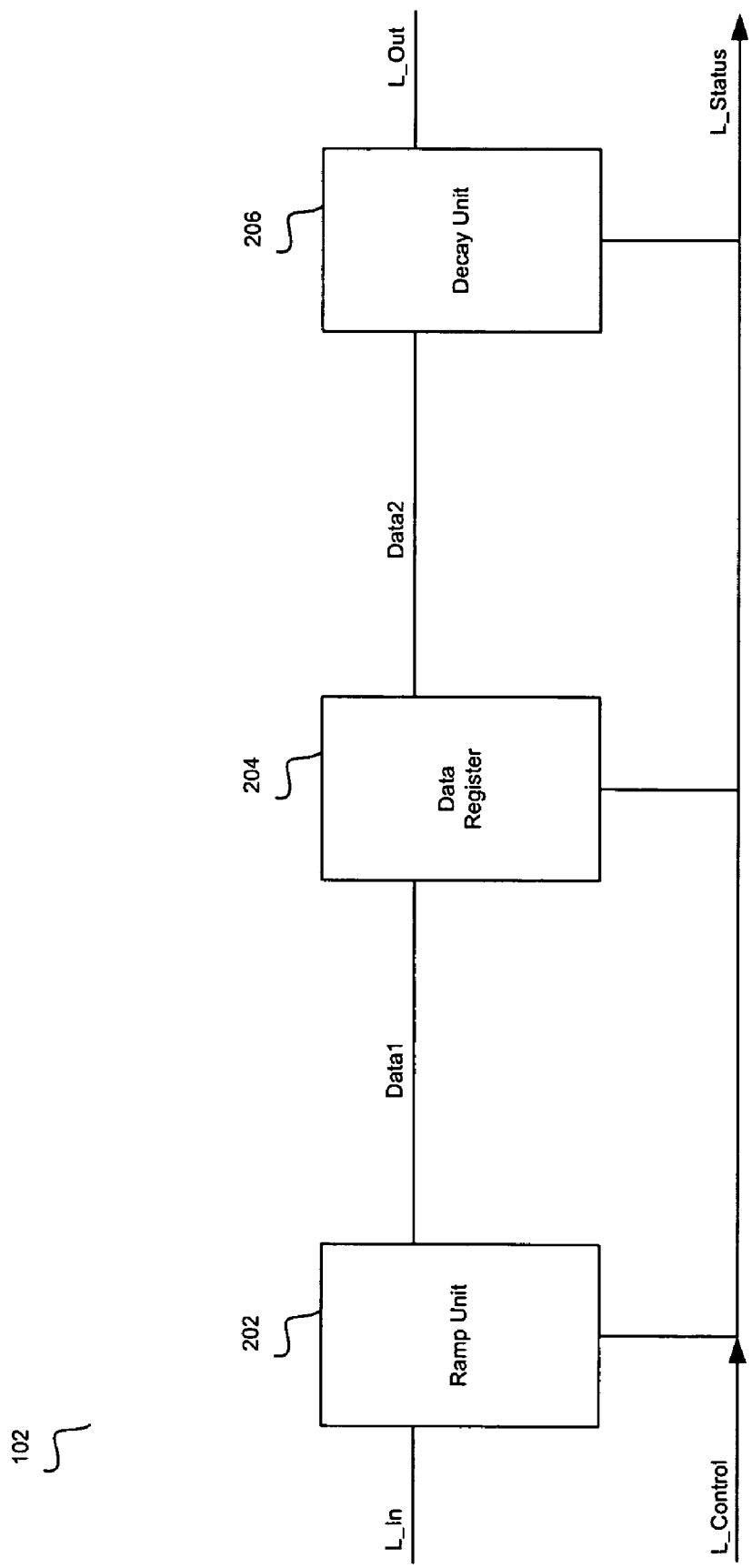
FIG. 2 is a block diagram of an exemplary embodiment of a ramp and decay unit of FIG. 1, for example, in accordance with an embodiment of the invention.

FIG. 2 is a block diagram of an exemplary embodiment of a ramp and decay unit of FIG. 1, for example, in accordance with an embodiment of the invention. Referring to FIG. 2, there is shown ramp unit (RU) 202, data register (DR) 204 and decay unit (DU) 206.

The RU 202 comprises suitable logic, circuitry and/or code that may be utilized to gradually increase the volume of the left audio channel signal L_In. The DR 204 comprises suitable logic, circuitry and/or code that may be utilized to temporarily hold the left audio channel signal from the RU 202. The DU 206 comprises suitable logic, circuitry and/or code that may be utilized to gradually decrease the left audio channel signal.

Data1 is a signal which may be coupled to the output of RU 202 and to the input of DR 204, and may be utilized to carry the left audio channel signal after it has been processed by the RU 202. Data2 is a signal which may be coupled to the output of DR 204 and to the input of DU 206, and may be utilized to carry the left audio channel signal.

The RU 202 may be controlled by a plurality of control signals, and may be adapted to modify a sudden change from low to high signal values in the input L_In such that the output Data1 may have a more gradual change from low to high signal values than L_In. When there is no need to ramp the signal, the RU 202 may pass the input signal such that the output signal Data1 is the same as the input signal L_In. Data1 may be the input to the DR 204 which may be controlled by a plurality of control signals, and may be adapted to temporarily hold the data to output it as Data2. Data2 may be the input to the DU 206. The DU 206 may be controlled by a plurality of control signals, and may be adapted to modify a sudden change from high to low signal values in the input Data2 such that the output L_Out may have a more gradual change from high to low signal values than Data2. When there is no need to decay the signal, the DU 206 may pass the signal such that the output signal L_Out is the same as the input signal Data2. RU 202, DR 204 and DU 206 may send status signals via L_Status to the CU 110 (FIG. 1).

Figure 3:
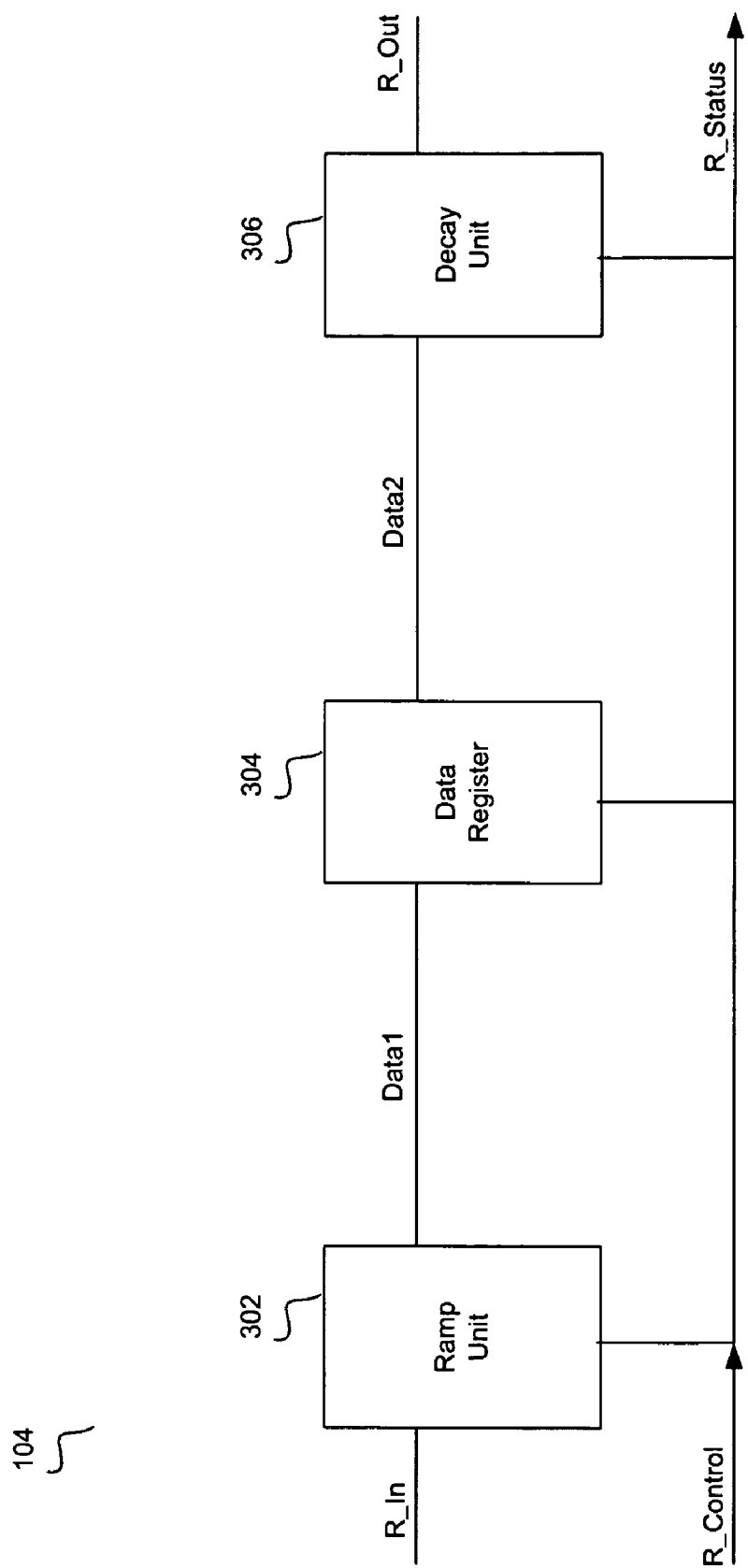
FIG. 3 is a block diagram of an exemplary embodiment of a ramp and decay unit of FIG. 1, for example, in accordance with an embodiment of the invention.

FIG. 3 is a block diagram of an exemplary embodiment of a ramp and decay unit of FIG. 1, for example, in accordance with an embodiment of the invention. Referring to FIG. 3, there is shown ramp unit (RU) 302, data register (DR) 304 and decay unit (DU) 306.

The RU 302 may comprise suitable logic, circuitry and/or code that may be utilized to gradually increase the volume of the left audio channel signal R_In. The DR 304 comprises suitable logic, circuitry and/or code that may be utilized to temporarily hold the left audio channel signal from the RU 302. The DU 306 comprises suitable logic, circuitry and/or code that may be utilized to gradually decrease the right audio channel signal.

Data1 is a signal which may be coupled to the output of RU 302 and to the input of DR 304, and may be utilized to carry the right audio channel signal after it has been processed by the RU 302. Data2 is a signal which may be coupled to the output of DR 304 and to the input of DU 306, and may be utilized to carry the right audio channel signal.

The RU 302 may be controlled by a plurality of control signals, and may be adapted to modify a sudden change from low to high signal values in the input R_In such that the output Data1 may have a more gradual change from low to high signal values than R_In. When there is no need to ramp the signal, the RU 302 may pass the input signal such that the output signal Data1 is the same as the input signal R_In. Data1 may be the input to the DR 304 which may be controlled by a plurality of control signals and may be adapted to temporarily hold the data to output it as Data2. Data2 may be the input to the DU 306. The DU 306 may be controlled by a plurality of control signals, and may be adapted to modify a sudden change from high to low signal values in the input Data2 such that the output R_Out may have a more gradual change from high to low signal values than Data2. When there is no need to decay the signal, the DU 306 may pass the signal such that the output signal R_Out is the same as the input signal Data2. RU 302, DR 304 and DU 306 may send status signals via R_Status to the CU 110 (FIG. 1).

Figure 4:
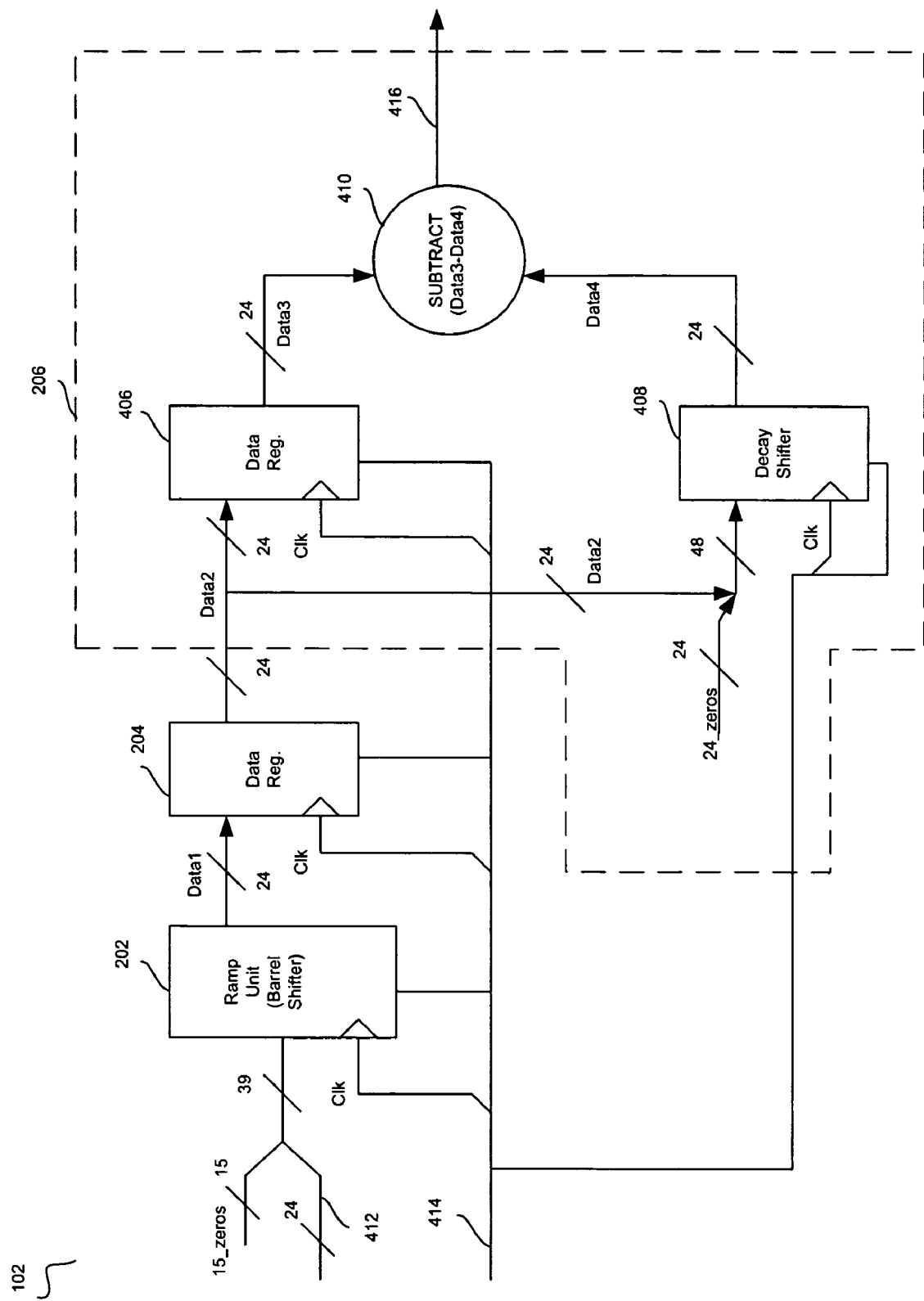
FIG. 4 is a block diagram illustrating an embodiment of the ramp and decay unit in accordance with an embodiment of the invention.

FIG. 4 is a block diagram illustrating an embodiment of the ramp and decay unit in accordance with an embodiment of the invention. Referring to FIG. 4, there is shown the RU 202, the DR 204, the DR 406, a DS 408, a subtractor 410, the input 412 to the RU 402, the control and status signals 414, and the output 416 from the subtractor 410.

The DR 406 comprises suitable logic, circuitry and/or code that may be utilized to temporarily hold the signal Data2 from the DR 204. The DS 408 comprises suitable logic, circuitry and/or code that may be utilized to hold an input, and output at least some portions of the input as indicated by various control signals. The subtractor 410 comprises suitable logic, circuitry and/or code that may be utilized to subtract an input from another.

An input signal 412 comprises a channel, left or right, of audio. A control signal and status signal 414 may comprise a plurality of signals to help control the actions of the components of an embodiment of the RDU 102 in accordance with an embodiment of the invention. An output signal 416 comprises a channel, left or right, of audio.

If the RU 202 (in FIG. 4) is enabled, the output of the RU 402 may change from a low value to a high value at a slower rate than the input signal 412. If the RU 202 is not enabled, the output may be the same as the input signal 412. The RU 202 may hold the output until the first data register 204 has accepted it. The first DR 204 may hold data temporarily until the second DR 406 and the DS 408 may have accepted the output. Similarly, the first DR 204 may hold the data from the RU 202 until it has been accepted by the second DR 406 and the DS 408.

In FIG. 4, the RU 202 is implemented as a barrel shifter. A barrel shifter shifts the input by a desired number of bit positions in one clock cycle, where the number of bit positions can be changed for each shift. The RU 202 may generate an output Data1 which may be an input to the DR 204, which may generate an output Data2 which may be an input to the DU 206. FIG. 4 shows DU 206 implemented by means of subtracting from the original signal to decay the original signal using the data register 406, the decay shifter (DS) 408 and the subtractor 410.

In one embodiment of the invention, the RU 202 in FIG. 4, a barrel shifter, may have thirty-nine bits of input and 24 bits of output. The twenty-four bits of the input signal 412 may be concatenated with fifteen bits, where each of the fifteen bits is set to zero, to form a 39 bit input to the RU 202. When a ramp-up function is enabled because a sudden transition from low to high volume is detected, the RU 202, the barrel shifter, may be signaled to output X bits of zeros along with the remainder of the 24−X bits from the input signal 412. For example, if X equals ten, then the most significant ten bits of the output Data1 would be zeros and the remaining fourteen bits of Data1 would be the most significant fourteen bits of the input signal 412. The number of bits shifted may be changed at various intervals so that in the output Data1, the number of zeros in the upper bits may be decreased while the number of input signal 412 bits may be increased, until finally all twenty-four bits of the input signal 412 may be output as Data1. When the ramp-up function is not enabled, the ramp unit 202, the barrel shifter, may output the 24 bits of the input signal 412 as Data1.

When enabled by various control signals, the DR 204 may clock in Data1 so that the output Data2 at that moment may be the same as the input Data1. Data2 may be the input to DU 206, where the DU 206 may comprise of a data register 406, a decay shifter (DS) 408 and a subtractor 410. When enabled by control signals, the DR 406 may clock in Data2 so that the output Data3 may be the same as the input Data2 at that moment. In accordance with an aspect of the invention, the DS 408, when enabled by its control signals, may clock in a forty-eight bit input formed from 24 bits of Data2 and 24 bits of zeros, and may save the Data2. The output of the DS 408 may be Data4. The subtractor 410 may subtract Data4 from Data3, and the resulting output may be the output signal 416. When control signals to the DS 408 indicate that decay is not needed, the output of the DS 408 may be all zeros, and, therefore, the output signal 416 may be the same as Data3.

When a sudden transition from high to low is detected, the control signals may indicate that the DS 408 may shift the saved Data2 so that Data4 may increase with each succeeding control signals to shift, until finally the output Data4 may be the same as Data3, at which time the output signal 416 of the subtractor 410 may have a value of zero.

Figure 5:
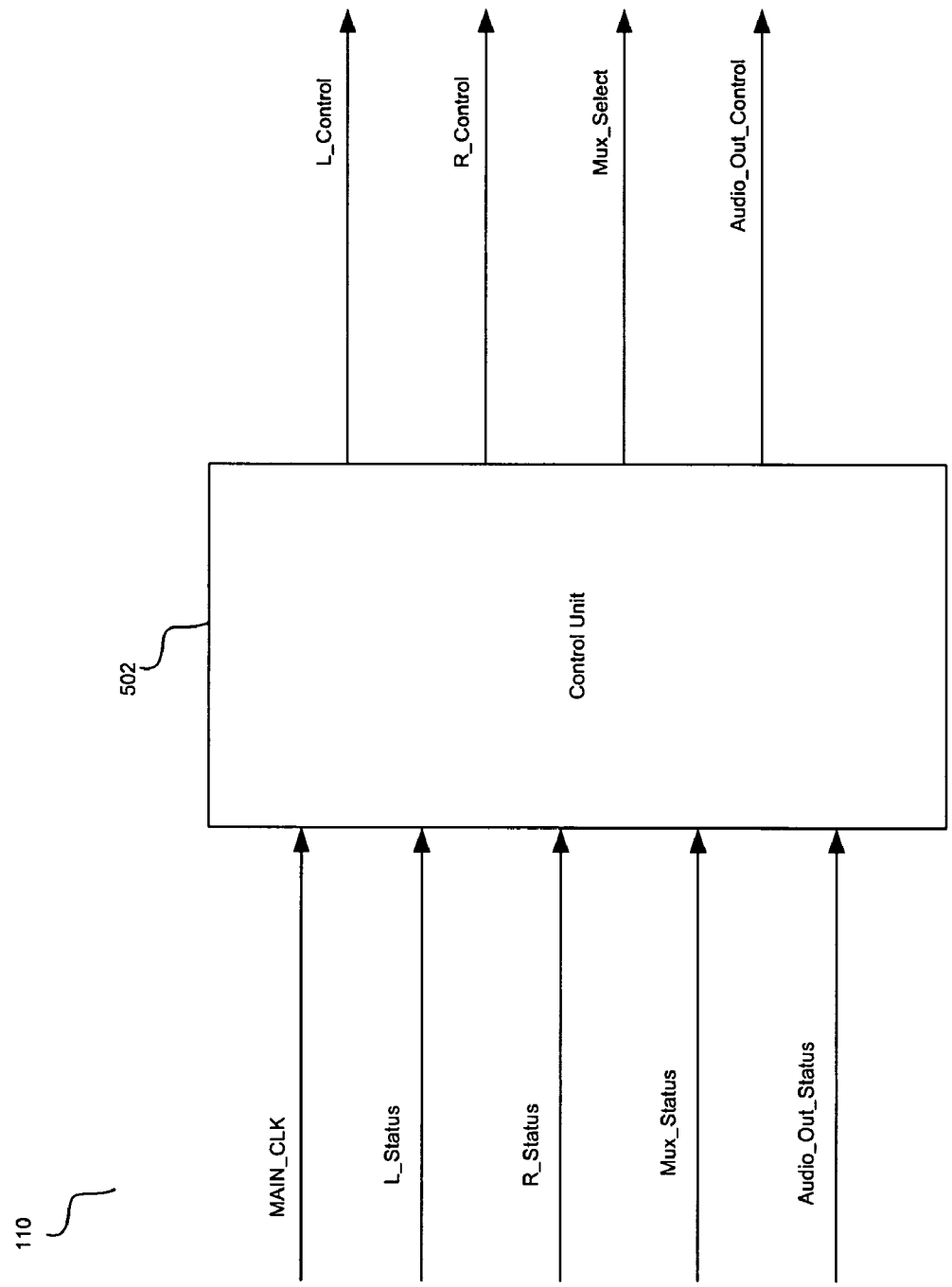
FIG. 5 is a block diagram illustrating the control unit of FIG. 1, for example, in accordance with an embodiment of the invention.

FIG. 5 is a block diagram illustrating the control unit of FIG. 1, for example, in accordance with an embodiment of the invention. Referring to FIG. 5, there is shown a CU 502, and signals MAIN_CLK, L_Status, R_Status, Mux_Status, Audio_Out_Status, L_Control, R_Control, Mux_Select, and Audio_Out_Control. The signal Main_Clk may be utilized by the CU 502 to generate a clocking signal needed by circuitry which may need the clocking signal, for example, the RU 202, the DR 204, the DR 406, and the DS 408, In contrast, an internal clock may be used to generate the clocking signal.

Figure 6:
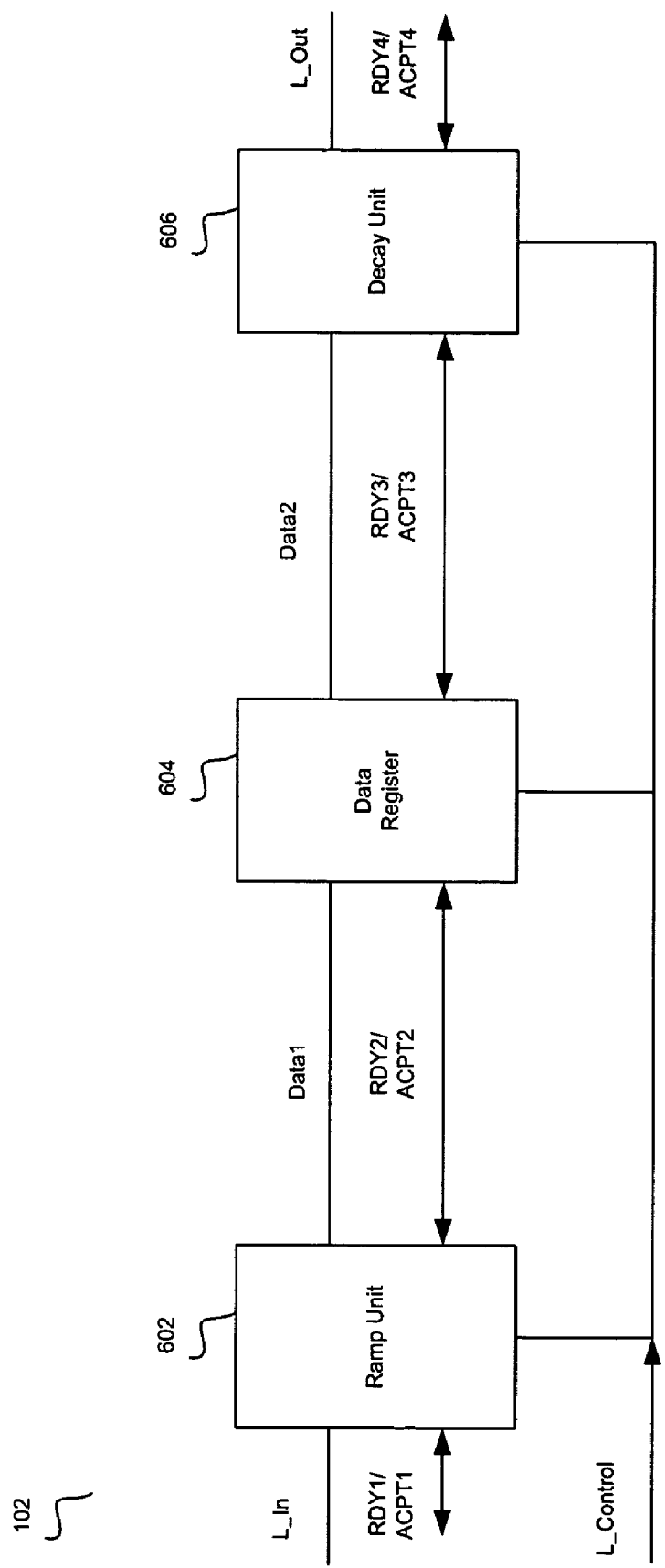
FIG. 6 is a block diagram illustrating an alternate embodiment of the control and status signals of an exemplary ramp and decay unit of FIG. 1, for example, in accordance with an embodiment of the invention.

FIG. 6 is a block diagram illustrating an alternate embodiment of the control and status signals of an exemplary ramp and decay unit of FIG. 1, for example, in accordance with an embodiment of the invention. Referring to FIG. 6, there is shown the ramp unit (RU) 602, the data register (DR) 604 and the decay unit (DU) 606, and control signals RDY1, ACPT1, RDY2, ACPT2, RDY3, ACPT3, RDY4 and ACPT4.

The RU 602 comprises suitable logic, circuitry and/or code that may be utilized to gradually increase the volume of the left audio channel signal L_In. The DR 604 comprises suitable logic, circuitry and/or code that may be utilized to temporarily hold the left audio channel signal from the RU 602. The DU 606 comprises suitable logic, circuitry and/or code that may be utilized to gradually decrease the left audio channel signal.

Data1 is a signal which may be coupled to the output of RU 602 and to the input of DR 604 and may be utilized to carry the left audio channel signal after it has been processed by the RU 602. Data2 is a signal which may be coupled to the output of DR 604 and to the input of DU 606 and may be utilized to carry the left audio channel signal.

The RU 602 may be controlled by a plurality of control signals, and may be adapted to gradually raise the volume level of the audio signal so as to avoid noise. When there is no need to ramp the signal, the RU 602 may pass the input signal L_In without changing the signal. The output of the RU 602 may go to the DR 604, which may be controlled by a plurality of control signals, and which may save the output of the RU 602 in order to have it available for the input of the DU 606. The DU 606 may be controlled by a plurality of control signals, and may be adapted to gradually decrease the volume of the audio signal so as to avoid noise. When there is no need to decay the signal, the DU 606 may pass the signal without changing the signal.

The ramp and decay function may comprise a plurality of processing stages which needs to clock in data, and each processing stage may utilize its own control logic which generates a ready signal and/or an accept signal. The ready signal may be synchronous and may indicate that the stage which generated the ready signal has valid data. The accept signal may be a combinatorial, asynchronous signal which may indicate to the previous stage that the current stage is accepting data from the previous stage which asserted its ready signal. In this regard a handshaking mechanism may be utilized to pipeline the flow of data from one stage to another.

A current stage may assert an accept signal when the current stage has no valid data or the current stage has valid data but the next stage is accepting the current data. A ready signal to the next stage may be asserted whenever an accept signal is asserted to the previous stage. A ready signal to the next stage may be deasserted when the next stage has asserted the accept signal. In case of an accept signal on the current stage and an accept signal from the next stage, the ready signal on the current stage may stay asserted.

In FIG. 6, the control signals RDY2 and ACPT2 may be coupled from the RU 602 to the DR 604, and the control signals RDY3 and ACPT3 may be coupled from the DR 604 to the DU 606. Each pair of ACPT/RDY signals may be asserted or deasserted locally by the present stage. For example, the DR 604 may assert ACPT2 to indicate to the RU 602 that the data from the RU 602 may be accepted by the DR 604. The RU 602 may then deassert the RDY2 signal and then assert it when the RU 602 has new data. The DR 604 may assert the RDY3 signal to indicate to the DU 606 that new data may be ready. Although only the RDU 102 is shown with localized control signals, this principle may be utilized by all components of the invention.

Although an exemplary embodiment of the invention shows the RU 202 (FIG. 2) as a barrel shifter 202 (FIG. 4), the RU 202 may be implemented with other circuitry, for example, with an adder, at least one shift register and at least one data register, or with at least one shift register and at least one data register. Similarly, although the exemplary embodiment of the invention shows the DU 206 (FIG. 2) comprising, among other things, a subtractor (FIG. 4), the DU 206 may be implemented with other circuitry, for example, with a barrel shifter, or with at least one shift register and at least one data register.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing audio signals, comprising:
receiving at least one control signal that indicates whether to enable a ramp-up function or a decay function;
when said ramp-up function is enabled, selecting at least one of a plurality of input audio bits via a barrel shifter;
pipelining transfer of said selected at least one of a plurality of input audio bits to at least one of a plurality of registers;
generating a shifted signal corresponding to at least a portion of said pipelined transferred and selected at least one of a plurality of input audio bits; and
generating an output audio signal comprising a difference of said pipelined transferred and selected at least one of a plurality of input audio bits and said shifted signal.

2. The method according to claim 1, comprising indicating via said at least one control signal, a number of bits that are to be shifted by said barrel shifter.

3. The method according to claim 1, wherein said at least one of a plurality of input audio bits comprise input audio data and a plurality of bits set to zero.

4. The method according to claim 3, wherein said pipelined transferred and selected at least one of a plurality of input audio bits comprise any combination of at least a portion of said plurality of bits set to zero and at least a portion of said input audio data.

5. The method according to claim 4, comprising, when said ramp-up function is enabled, increasing a value of successive ones of said pipelined transferred and selected at least one of a plurality of input audio bits in at least one successive iteration by selecting fewer of said plurality of bits set to zero.

6. The method according to claim 1, comprising generating said shifted signal utilizing a shift register.

7. The method according to claim 6, comprising indicating by said at least one control signal, a number of bits that are to be shifted by said shift register.

8. The method according to claim 6, wherein said pipelined transferred and selected at least one of a plurality of input audio bits and a second input comprising a plurality of bits set to zero are inputs to said shift register.

9. The method according to claim 8, wherein said shifted signal comprises any combination of at least a portion of said pipelined transferred and selected at least one of a plurality of input audio bits and at least a portion of said second input comprising a plurality of bits set to zero.

10. The method according to claim 9, comprising, when said decay function is enabled, increasing a value of successive ones of said shifted signal by shifting fewer bits of said second input comprising a plurality of bits set to zero to said shifted signal thereby reducing said output audio signal.

11. A system for processing audio signals, comprising:
circuitry to receive at least one control signal that indicates whether to enable a ramp-up function or a decay function;
a barrel shifter to select at least one of a plurality of input audio bits when said ramp-up function is enabled;
at least one of a plurality of registers to pipeline transfer said selected at least one of a plurality of input audio bits;
a generated shifted signal corresponding to at least a portion of said pipelined transferred and selected at least one of a plurality of input audio bits; and
a subtractor to generate an output audio signal comprising a difference of said pipelined transferred and selected at least one of a plurality of input audio bits and said shifted signal.

12. The system according to claim 11, wherein said at least one control signal indicates a number of bits to be shifted by said barrel shifter.

13. The system according to claim 11, wherein said at least one of a plurality of input audio bits comprise input audio data and a plurality of bits set to zero.

14. The system according to claim 13, wherein said pipelined transferred and selected at least one of a plurality of input audio bits comprise any combination of at least a portion of said plurality of bits set to zero and at least a portion of said input audio data.

15. The system according to claim 14, wherein said barrel shifter increases a value of successive ones of said pipelined transferred and selected at least one of a plurality of input audio bits in at least one iteration by selecting fewer of said plurality of bits set to zero when said ramp-up function is enabled.

16. The system according to claim 11, comprising a shift register to generate said shifted signal.

17. The system according to claim 16, wherein said at least one control signal indicates a number of bits to be shifted by said shift register.

18. The system according to claim 16, wherein said shift register has as inputs said pipelined transferred and selected at least one of a plurality of input audio bits and a second input comprising a plurality of bits set to zero.

19. The system according to claim 18, wherein said shifted signal comprises any combination of at least a portion of said pipelined transferred and selected at least one of a plurality of input audio bits and at least a portion of said second input comprising a plurality of bits set to zero.

20. The system according to claim 19, wherein, when said decay function is enabled, said output audio signal is reduced by said shift register increasing a value of successive ones of said shifted signal by shifting fewer bits of said second input comprising a plurality of bits set to zero to said shifted signal.

21. A system for processing audio signals, comprising:
a barrel shifter that receives at least one of a plurality of input audio bits comprising input audio data and a first plurality of bits set to zero;
said barrel shifter generates an output comprising any combination of at least a portion of said input audio data and at least a portion of said first plurality of bits set to zero;
a first data register coupled to an output of said barrel shifter;
a second data register coupled to an output of said first data register;
a subtractor, wherein a first input to said subtractor is coupled to an output of said second data register;
an input of a shift register coupled to an output of said first data register;
a second plurality of bits set to zero further coupled to said input of said shift register;
said shift register generates an output comprising any combination of at least a portion of said second plurality of bits set to zero and at least a portion of said output of said first data register;
a second input to said subtractor being coupled to said output of said shift register;
said subtractor generates an output comprising said output of said second data register minus said output of said shift register;
at least one received control signal that indicates to said barrel shifter a number of bits to shift;
said at least one received control signal that indicates to said shift register a number of bits to shift; and said at least one received control signal that is utilized as a clocking signal by said barrel shifter, said first data register, said second data register, and said shift register.

22. The system according to claim 21, comprising at least one control signal generated by a first circuitry which generates an output, said first circuitry comprising at least one of said barrel shifter, said first data register, said second data register, and said decay shifter, such that said generated control signal indicates to a second circuitry that accepts said generated output, said second circuitry comprising at least one of said barrel shifter, said first data register, said second data register, and said decay shifter, that said generated output is a valid output.

23. The system according to claim 21, comprising at least one control signal generated by a first circuitry which accepts as input generated data, said first circuitry comprising at least one of said barrel shifter, said first data register, said second data register, and said shift register, such that said generated control signal indicates to a second circuitry which sent said generated data, said second circuitry comprising at least one of said barrel shifter, said first data register, said second data register, and said decay shifter, that said generated data has been received.

* * * * *